United States Patent [19]
Giebel et al.

[11] Patent Number: 5,912,581
[45] Date of Patent: Jun. 15, 1999

[54] SPURIOUS-EMISSION-REDUCING TERMINAL CONFIGURATION FOR AN INTEGRATED CIRCUIT

[75] Inventors: Burkhard Giebel, Denzlingen; Ulrich Theus, Gundelfingen, both of Germany

[73] Assignee: Micronas Semiconductor Holding AG, Zurich, Switzerland

[21] Appl. No.: 08/919,455

[22] Filed: Aug. 28, 1997

[30] Foreign Application Priority Data

Aug. 29, 1996 [EP] European Pat. Off. ............ 961137973

[51] Int. Cl.$^6$ .................................................. H01L 21/82
[52] U.S. Cl. ......................................... 327/530; 327/545
[58] Field of Search ..................................... 327/530, 531, 327/532, 538, 540, 544–547, 551, 564, 565; 307/3, 31, 32, 42, 100

[56] References Cited

U.S. PATENT DOCUMENTS 4,529,890  7/1985  Kobayashi et al. ...................... 327/108
4,710,771  12/1987  Banno et al. ........................... 340/811

OTHER PUBLICATIONS

Patent Abstracts Of Japan, vol. 013, No. 330 (E–793), Jul. 25, 1989 & JP01094646 A (Fujitsu Ltd.), Apr. 13, 1989.
Patent Abstracts Of Japan vol. 013, No. 240 (E–767), Jun. 6, 1989 & JP01042462 A (Mitsubishi Electric Corp), Feb. 14, 1989.

On–Chip Decoupling Capacitor For Logic VLSI Chips, IBM Technical Disclosure Bulletin, vol. 30, No. 3, Aug. 1987, New York, US.

Copy of EPO Search Report for 96113797.3, dated Jan. 23, 1997.

*Primary Examiner*—My-Trang Nu Ton
*Attorney, Agent, or Firm*—Arthur L. Plevy

[57] ABSTRACT

Spurious-emission-reducing terminal configuration for an integrated circuit, particularly a monolithic integrated circuit, operable within an unshielded board network, the integrated circuit being divided into a first subcircuit, which has essentially radio-frequency current components, and a second subcircuit, which has essentially low-frequency current components, the separation also extending to the internal supply lines and supply contact pads. The second subcircuit includes driver circuits which are connected to I/O lines on the board network. On the grounded side, the first and second supply current paths are interconnected within the integrated circuit by a low-resistance and low-inductance connection to establish a ground point.

18 Claims, 3 Drawing Sheets

SPURIOUS-EMISSION-REDUCING TERMINAL CONFIGURATION FOR AN INTEGRATED CIRCUIT

FIELD OF THE INVENTION

This invention relates to a spurious-emission-reducing terminal configuration for an integrated circuit, particularly a monolithic integrated circuit, which may be located within a package or a plastic encapsulation.

BACKGROUND OF THE INVENTION

The trend towards integration of ever-increasing numbers of functions in an integrated circuit leads to smaller and smaller design geometries and higher and higher processing speeds. If clocked CMOS circuits are used, the current drain is highly clock-synchronous and pulsed. Hybrid circuits do not differ in this respect if the package contains, besides analog circuits, clocked circuits, particularly CMOS circuits, with steep current pulse edges. Examples of clocked circuits with high pulsed current drain are control units, microprocessors, and digital signal processors for various applications. With the progress in miniaturization and the increase in switching speeds associated therewith, the harmonic content of these pulsed supply and load currents increases. A consequence of this is the conducted electromagnetic waves which leave the integrated circuit on the supply and input/output (I/O) lines. This may result in mutual interference in interacting circuit arrays or in non-permissible electromagnetic emissions which interfere with the operation of other electronic equipment.

A critical application for clocked circuits is in the automotive field, because no shielding of the printed circuit boards and the associated connecting leads is possible there on cost grounds, so that radio-frequency interference can easily propagate via an unshielded board assembly. The interference is then audible in the radio set, car telephone, etc. Particularly in this field of application, the discussion about electromagnetic compatibility (EMC) has, in recent years, led to a definition of emission limits which new systems must meet.

The attempt to prevent the interference from leaving the integrated circuit by installing chokes in the supply lines, easily results in critical fluctuations in the voltage supply of the integrated circuit; the supply voltage may even briefly drop below its minimum value. Moreover, the installation of chokes in the supply lines does not suppress the interference conducted by the I/O lines. Elimination of such interference requires separate measures on each of the existing I/O lines.

How the pulsed supply and load currents act via the supply and I/O lines of an unshielded board network is illustrated schematically in FIGS. 1 and 2 by the associated radio-frequency and low-frequency current components. For simplicity it will be assumed that the ohmic resistances of the networks shown are small compared with the effective reactances for the radio-frequency current components.

Interference in the case of which the radio-frequency current components are conducted via relatively large-area current loops, is particularly unpleasant since, the area around which he radio-frequency currents flow defines directly the magnetically emitting area and is thus, Proportional to the radiated electromagnetic energy. Primarily, the supply lines of the clock circuit stages are affected. But the output drivers, too, may form such current loops via their I/O lines, the distributed capacitances of the latter, and the input capacitances of the connected systems, such as a display, with current feedback taking place over the supply or ground connection lines. In the case of I/O lines, very large-area current loops may occur, which then become effective as magnetically emitting areas in a similar manner. But even if no currents are flowing, the I/O lines cause disturbances through the capacitive emission of the signal edges and undesired level discontinuities.

Aside from appropriate I/O-line and ground-line routing, the interference caused by the signal edges on the I/O lines can be reduced by slowing down the signal edges or by arranging that the switching event occurs only very rarely and irregularly. However, a slowdown of the signal edges of the output drivers will be only partly effective if rapid level fluctuations are still present on the I/O lines. These undesirable level fluctuations are caused by rapid level fluctuations on the supply or grounded sides of the respective I/O drivers, with the insufficient choking of the supply lines playing an essential part, as mentioned above. In any case, the level fluctuations on the I/O lines have the same effect as if I/O drivers with steep signal edges were present.

It is therefore, an object of the invention to solve the emission problem on the supply and I/O lines of an integrated circuit within an unshielded board network, by providing a low-cost, spurious-emission-reducing terminal configuration for the integrated circuit.

SUMMARY OF THE INVENTION

A spurious-emission-reducing terminal configuration for an integrated circuit, particularly a monolithic integrated circuit, operable within an unshielded board network, wherein the integrated circuit is divided into a first subcircuit, which causes essentially radio-frequency current components on the supply lines, and a second subcircuit, which causes essentially low-frequency current components on the supply lines, and wherein said radio-frequency and low-frequency current components are routed over separate supply current paths which are connected to external filter means for blocking the radio-frequency current components. The common ground is formed by a low-resistance and low-inductance connection on the grounded side of the supply current paths.

The separation of the supply current paths makes it possible to effectively block the radio-frequency current components in the associated supply current path without affecting the supply of the current components in the other supply current path. Thus, the radio-frequency current components, which are the sole cause of the interference, are isolated from the external board lines, which are connected as supply or I/O lines to the integrated circuit. The capacitive and/or electromagnetic emissions via the unshielded board network are thus prevented. For the low-frequency subcircuits, particularly the I/O driver circuits, a stable supply and ground potential is made available.

The invention further relates to an integrated circuit which can be used as an unpackaged chip version or as an encapsulated component in such an unshielded board network with no spurious emission occurring.

BRIEF DESCRIPTION OF THE DRAWINGS

The invention and preferred embodiments thereof will now be explained in more detail with reference to the accompanying drawings, in which.

DETAILED DESCRIPTION OF THE INVENTION

Figure 1:
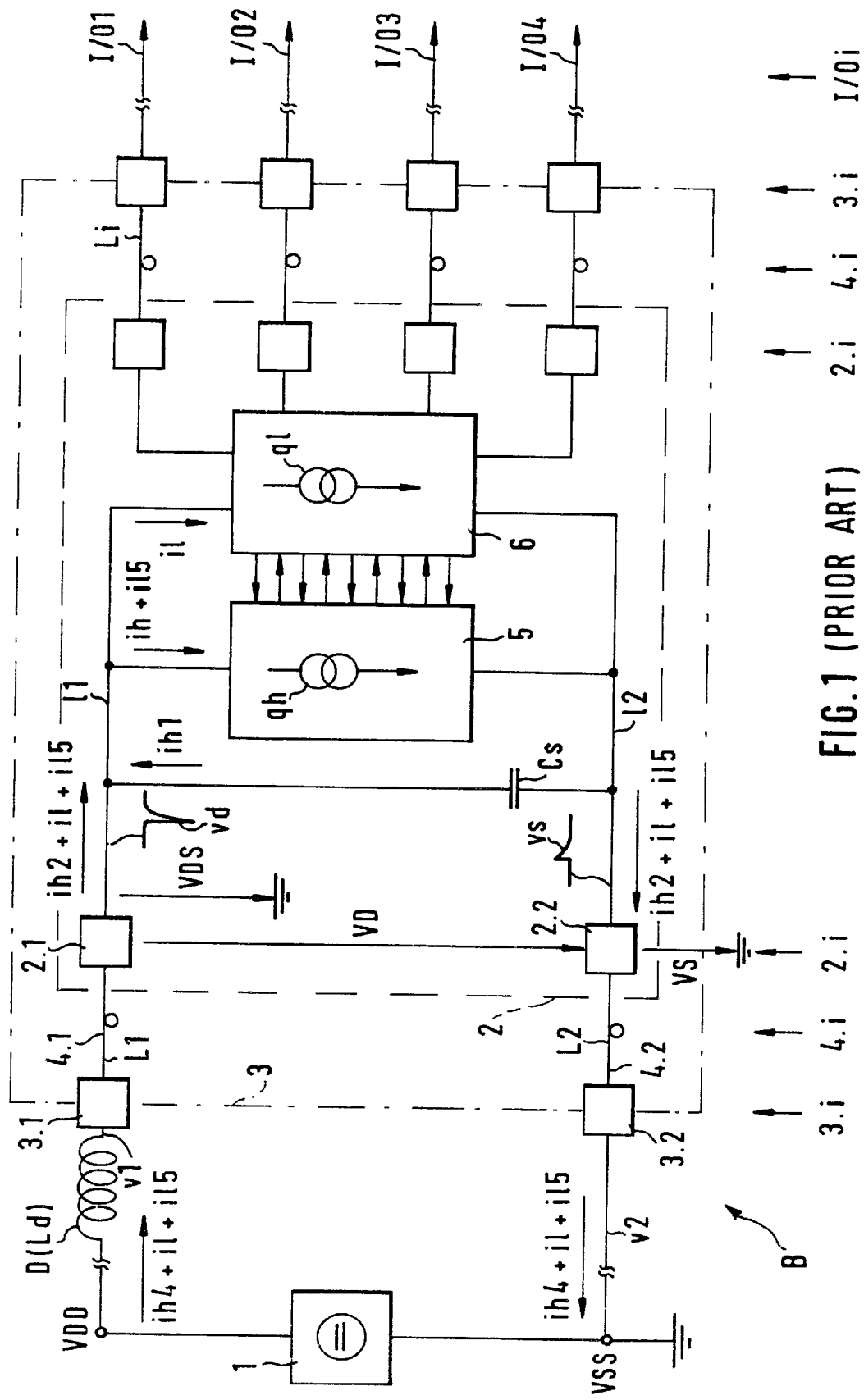
FIG. 1 shows the equivalent circuit of an unshielded board network with an integrated circuit, with radio-frequency current components on the supply lines blocked by a choke.

FIG. 1 shows an equivalent circuit of an unshielded board network B in which the radio-frequency current components ih of the integrated circuit 2 are blocked by means of a choke D. The functional units and circuit modules of the board network B are a voltage regulator 1, the integrated circuit in a package 3 or an encapsulation, supply lines v1, v2, by which the integrated circuit 2 is connected to the voltage regulator 1, and some I/O lines I/O1 to I/O4, which are connected to the integrated circuit 2. The distance between the voltage regulator 1 and the integrated circuit 2 or the associated package 3 is bridged by the two supply lines v1, v2. The voltage regulator 1 provides at its output terminal the supply potential VDD. Its other terminal VSS is connected to ground. The ground line v2 on the board network B should have is little resistance and inductance as possible, so that a stable reference potential is available or the entire board. On cost grounds, this requirement can only be met approximately.

The source of the interference signals proper lies within the integrated circuit 2 and is formed by the many clock-controlled switching stages through which short-time shunt currents flow in the worst case. However, the main current contribution comes from a multitude of gate capacitances, which are charged or discharged in clock-controlled synchronism. The clocked stages have been combined schematically in a first subcircuit 5, which contains a radio-frequency current source qh as a circuit symbol. A second subcircuit 6 is connected to the subcircuit 5 by a plurality of signal lines. The second subcircuit 6 contains essentially parts which produce no radio-frequency currents on the supply lines. These parts are analog circuits or circuits which are locked to a slow processing clock and thus must produce only slowly rising signal edges. They include particularly the I/O circuits, which exchange data or signals over I/O lines I/Oi. In the subcircuit 6, the low-frequency currents il are symbolized by a low-frequency current source q1.

The integrated circuit 2 has peripheral contact pads 2.I which are connected by interconnections 4.I to associated package terminals 3.i. The package terminals 3.I are connected to the lines of the board network B in the usual manner, e.g., by soldered joints. For the radio-frequency current components ih, the lines 11, 12 or v1, v2 on the integrated circuit 2 or on the board network B are no longer ideal, but besides presenting ohmic resistances, they also have inductances and stray capacitances. An essential contribution to the inductance is provided by the interconnections 4.I, which are generally implemented as bonding wires. For a gold wire with a diameter of 25 micrometers and a length of 1.5 mm, or example, the inductances L1, L2, Li have a value of approximately 1.5 nH.

The integrated circuit 2 generally includes an internal capacitor Cs which blocks a part ih1 of the radio-frequency currents ih. In a hybrid circuit, this capacitor Cs may be an additional component which is spatially closely connected with the clocked subcircuit 5, so that its effectiveness is not hampered by inductive leads. But even in the case of a monolithic integrated circuit, an internal blocking capacitor Cs may be included on-chip, e.g., by a double wiring level in the edge region and on free areas. The lead inductances are then minimal. Unfortunately the attainable capacitance is limited for reasons of cost and area.

The equivalent board circuit of FIG. 1 contains all functional units which are important for the radio-frequency current components ih. Starting from the current sources qh, ql and the individual conductive paths, the respective low- and radio-frequency current components are given, which eventually reach the voltage regulator 1 via the first and second supply lines v1, v2. The first subcircuit 5 produces the radio-frequency current component ih and a low-frequency current component il5, which includes a direct-current component. The second subcircuit 6 produces the low-frequency current component il, which also includes the direct-current component as the current to be consumed. All current components reach the first and second internal supply lines 11, 12 which are connected to the first and second contact pads 2.1 and 2.2, respectively, of the integrated circuit 2. A part ih1 of the radio-frequency current component ih does not reach the contact pads 2.1, 2.2 but is blocked by the internal capacitor Cs. How large this part ih1 is in comparison with the remaining part ih2 of the radio-frequency urgent component depends only on how high the admittance of the internal capacitor Cs is in comparison with the admittance of the supply path through the voltage regulator 1. In the board network B of FIG. 1, this admittance of the supply path is kept low by a choke D of inductance Ld inserted in the first supply line v1, which inductance must be added to the inductances L1, L2 of the two interconnections 4.1, 4.2, with the inductance Ld of the choke being higher than the inductance Li of the interconnections 4.I by a few orders of magnitude.

It is also possible to supplement the internal capacitor Cs with an external capacitor which would have one terminal connected to the first supply line v1 between the choke D and the first package terminal 3.1, and whose second terminal would have to be connected to the second supply line v2; the points of connection should be as close to the first and second package terminals 3.1, 3.2 as possible. In that case, a current path would again be available for a part of the radio-frequency current component ih of the first subcircuit 5 via the inductive interconnections 4.1 and 4.2, which ought to have been prevented by the choke D, cf. the capacitor Cl and the associated radio-frequency current component ih3 in FIG. 2. In FIG. 1 (i.e., without the external capacitor C1), the radio-frequency current component ih4, which is just passed by the choke D, is identical with the current component ih2, which is routed over the interconnections 4.1, 4.2.

From the equivalent circuit diagram of FIG. 1 it can be seen that the radio-frequency current components ih2 and ih4 cause a clock-synchronous voltage drop across the choke D and the inductances L1, L2, so that only a reduced supply voltage VD is available at the contact pads 2.1, 2.2. The voltage VD is subject to temporal fluctuations which are synchronous particularly with the clock signal and exhibit voltage spikes. Both the internal supply potential VDS and the internal ground potential VS fluctuate. In FIG. 1 this is shown schematically by spikes vd, vs. Depending on the value of the inductance Ld of the choke D in comparison with the inductances L1, L2 of the two interconnections 4.1, 4.2 and the two supply lines v1, v2, the spikes vd, vs shift more or less completely to the supply-voltage side. With the relatively large inductance Ld of the choke D, the spike vs on the ground side is negligible compared to the spikes vd on the supply side. This has a corresponding effect on the output signals of the driver stages in the second subcircuit 6.

Depending on the logic state, the driver stages connect the external I/O lines to the internal supply potential VDS or to the internal ground potential VS. The spikes vd, vs of these potentials are thus transmitted over low-resistance paths to the I/O lines. Accordingly, the needle-shaped level fluctuations result in voltage spikes and/or compensating currents. Thus, capacitive or inductive noise is produced.

If the choke D is supplemented with an external capacitor Cl as mentioned above, the spikes vd, vs will approach each other in magnitude, with the opposite polarity being preserved. This is caused by the relatively low-inductance current path through the capacitor C1, through which the radio-frequency current component ih3 can flow (see FIG. 2). Compared with the inductive current path through the choke D, the current component ih3 is substantially (possible orders of magnitude) greater than the current component ih4. The current components ih3, ih4 flow through the interconnections 4.1, 4.2 together and cause, via the inductances L1, L2 of the latter, the voltage spikes vd, vs, which are equal in magnitude for equal inductances L1, L2. The penalty paid for the reduction of the spikes vd on the internal supply side VDS is a deterioration of the internal ground potential VS. Thus, the effect of the interference suppression measures is changed considerably by the external capacitor C1—strictly speaking, this is a different suppression measure, which rather corresponds to the interference suppression of FIG. 2.

Figure 2:
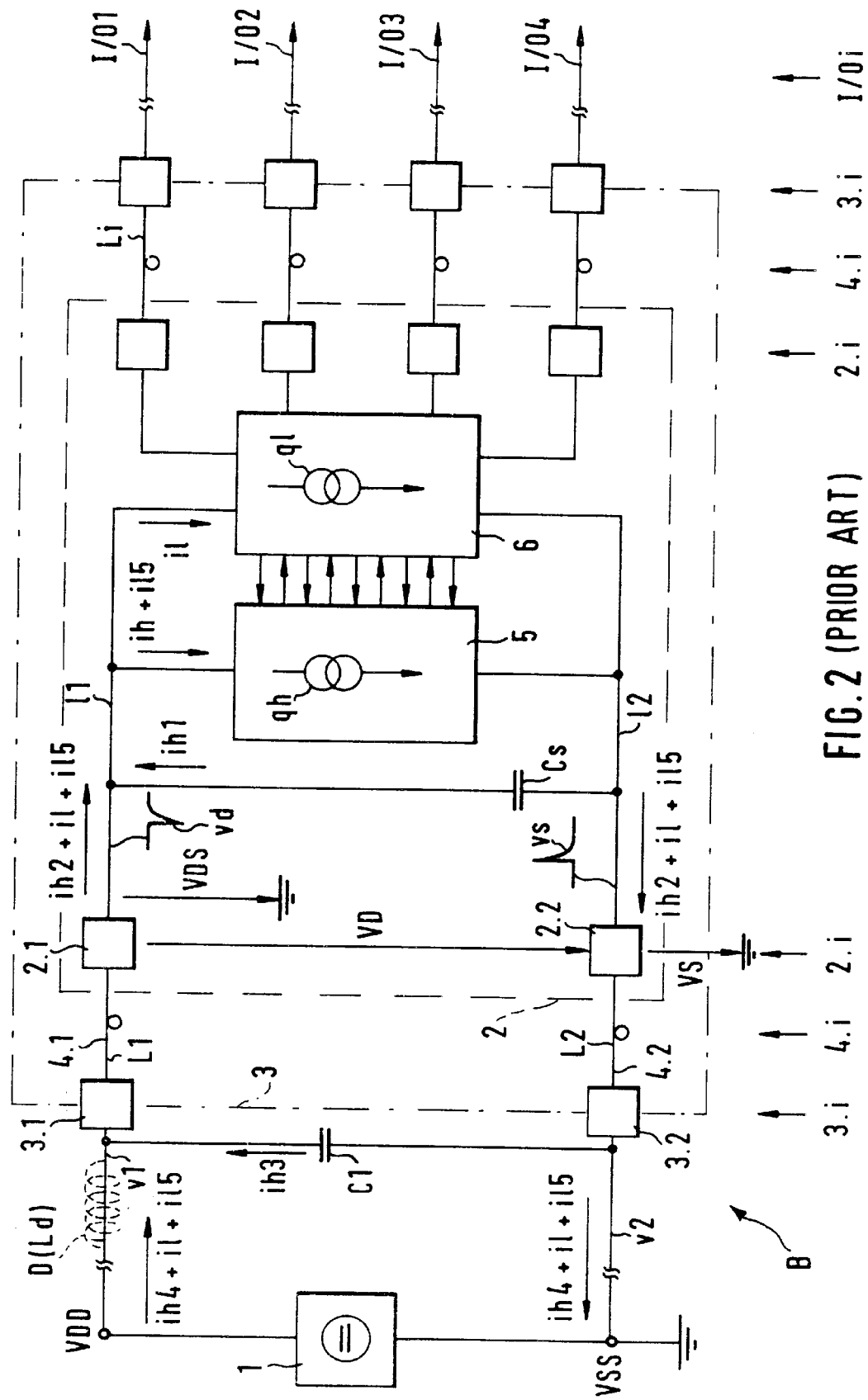
FIG. 2 shows the equivalent circuit of another unshielded board network with an integrated circuit, with radio-frequency current components on the supply lines blocked by a blocking capacitor.

The equivalent circuit of FIG. 2 contains essentially the same circuit modules and functional units as the equivalent circuit of FIG. 1. Like parts are designated by like reference characters, so that a renewed discussion is not necessary. The essential difference between FIG. 2 and FIG. 1 lies in the design of the external means by which the radio-frequency current components ih are to be kept away from the first and second supply lines v1, v2. In FIG. 1, this is accomplished by means of the choke D in the first supply line v1. In FIG. 2, the essential filter means is the external capacitor C1. The advantage of the arrangement of FIG. 2 over that of FIG. 1 is that the capacitor C1, which is located as close to the package 3 as possible, makes available to the integrated circuit 2 the radio-frequency current components ih3, for which the voltage regulator 1 is too slow. A choke D may additionally be inserted in the first supply line v1, cf. the further remarks on FIG. 1. However, the combination of choke D and capacitor C1 in the external supply lines v1, v2 in FIGS. 1 and 2 may also present problems, since it forms a resonant circuit in which self-oscillations can be excited.

The effect of the interference suppression circuit of FIG. 2 in comparison with FIG. 1 consists in the fact that in FIG. 2 the oppositely directed voltage spikes vd, vs at the internal supply terminals 2.1, 2.2 are approximately equal in magnitude, whereas the voltage spike vd by itself is substantially smaller, e.g., only half that of FIG. 1. The penalty to be paid for this is that the spike vs on the internal ground potential VS is no longer negligible as in FIG. 1. The differences between the interference suppression circuits of FIGS. 1 and 2 show via the respective drivers in the I/O lines, which transmit the voltage spikes vd, vs as interference signals over a low-impedance path to the I/O lines even without a change of the respective logic state.

In the board network B of FIG. 2, the radio-frequency current component ih of the first subcircuit 5 is divided into the components ih1, ih2 by the internal capacitor Cs, with the component ih2 being conducted over the interconnections 4.1, 4.2 to the package terminals 3.1, 3.2. There, the component ih2 divides into the radio-frequency current components ih3, ih4. The component ih3 flows through the external capacitor C1, and the component ih4 flows through the voltage regulator 1. For the voltage spikes vd, vs at the internal supply terminals 2.1, 2.2, the respective radio-frequency current components ih4, ih2, and the respective inductances Ld, L1, L2 of the supply current path are responsible, like in FIG. 1.

From the two equivalent circuit diagrams of FIGS. 1 and 2 it is apparent that with the external filter means D, Cl, only limited interference suppression is possible by shifting the voltage spikes vd, vs either more to the supply-voltage side or more to the ground side. In addition, the filter means D, Cl are not selective enough, so that the respective other current component is always adversely affected.

Figure 3:
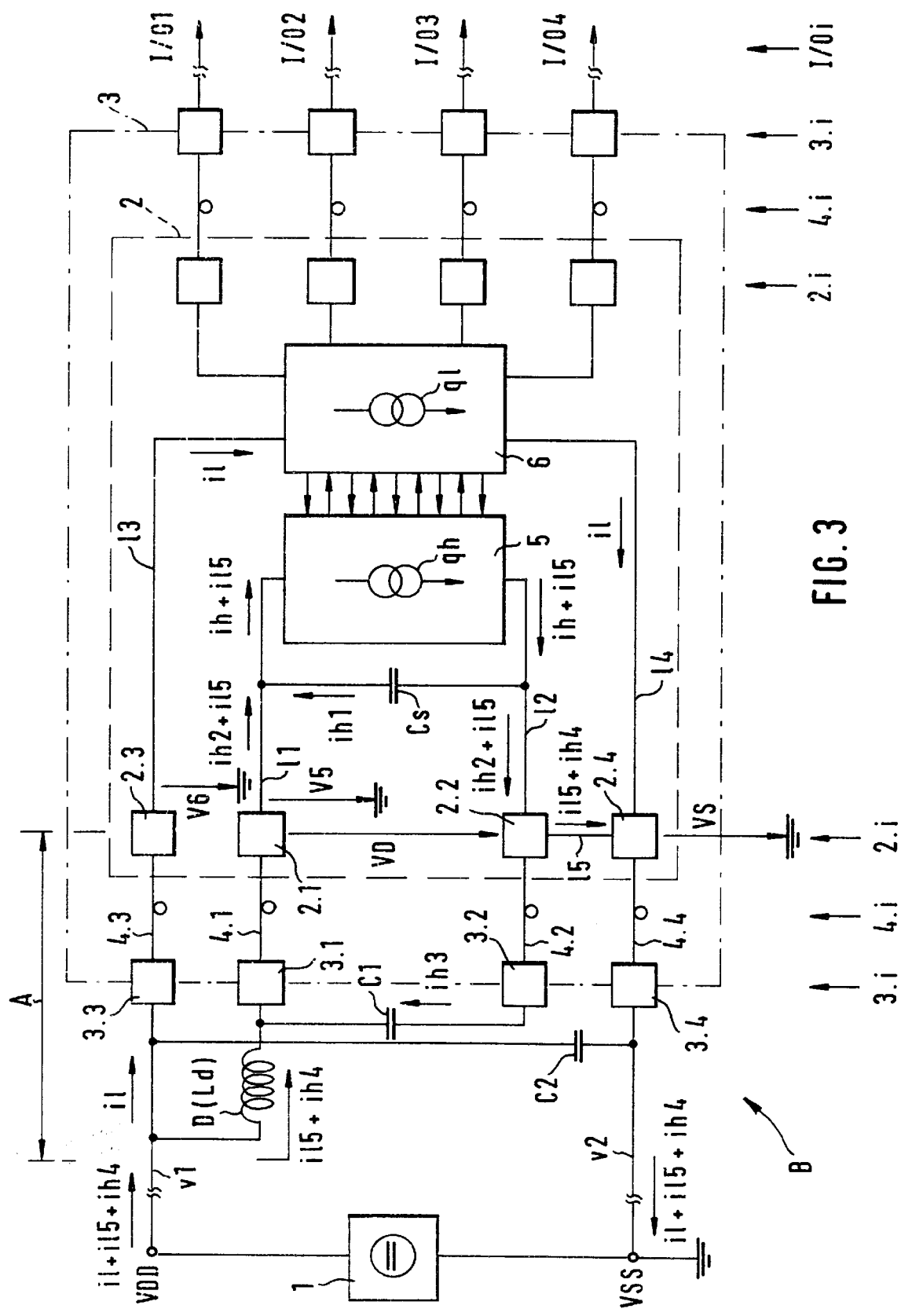
FIG. 3 shows the equivalent circuit of an unshielded board network with an integrated circuit wherein the terminal configuration according to the invention results in spurious emissions being substantially reduced.

The board network B shown schematically in FIG. 3, which comprises the integrated circuit 2 with the terminal configuration of the invention, contains essentially the same functional units as the board networks B of FIGS. 1 and 2. Since like circuit modules or functional units are designated by like reference characters throughout the three figures, their description need not be repeated. In contrast to the terminal configurations of FIGS. 1 and 2, where the first and second subcircuits 5 and 6 are connected to common internal supply lines 11, 12 with respect to their supply currents ih+il5 and il, respectively, in the terminal configuration of FIG. 3, the internal supply lines for the first and second subcircuits 5, 6 are also completely separated from each other. The first subcircuit is connected to the first contact pad 2.1 by the first line 11 and to the second contact pad 2.2 by the second line 12. The internal capacitor Cs, which is connected between the first and second lines 11, 12, blocks a portion ih1 the radio-frequency current component ih of the first subcircuit 5 like in FIG. 1 or FIG. 2.

To the second subcircuit 6, the supply voltage and the ground potential are applied separately, namely over a third line 13 and a fourth line 14, respectively, which are connected to a third contact pad 2.3 and a fourth contact pad 2.4, respectively. The separate supply of the supply currents continues in the area of the interconnections 4.1 and the package terminals 3.i. Third and fourth interconnections 4.3, 4.4 and third and fourth package terminals 3.3, 3.4 are provided. Like in FIG. 2, the external blocking capacitor Cl for the radio-frequency current components is connected to the first and second package terminals 3.1, 3.2.

The external blocking capacitor C1 is traversed by the radio-frequency current component ih3, which, according to the invention, should be as identical to the radio-frequency current component ih2 at the contact pads 2.1 and 2.2 as possible. This is only possible if the remaining current component ih4, which would have to flow through the voltage regulator 1, becomes negligible, i.e., tends to zero. This is achieved by means of a choke D which is inserted between the first voltage terminal 3. 1, to which the capacitor C1 is connected, and the first supply line v1, and whose reactance can be chosen to be high enough independently of the low-frequency current components il of the second subcircuit 6.

The third and fourth package terminals 3.3, 3.4 are advantageously shunted by a further external capacitor C2, which, however, has no effect on the radio-frequency current components of the first subcircuit 5 but only serves to meet the current requirement il of the second subcircuit 6. Radio-frequency current components which may occur in the second subcircuit 6 will follow a low-inductance current path through the capacitor C2 like in FIG. 2, and can thus reach the supply lines v1, v2 only in reduced form, if at all. Moreover, in the switching process, the current consumption i1 of the I/O drivers is greater than the current yield of the regulator 1, whose cutoff frequency is 1 megahertz, for example. The capacitor C2 thus also has a buffer function.

The splitting of the first and second supply lines v1, v2 into the separate supply-current paths in the package 3 and in the integrated circuit 2 is effected by the external filter means D, C1, C2 on the board network B in the manner of a current-branching network, cf. the connection section A in FIG. 3, which delimits the separate supply-current paths on the board B. The low-frequency current component il5 for the first subcircuit 5 and the remaining current component ih4 for this subcircuit, which tends to zero, flow through the choke D, which is connected at one end to the first supply line v1 and at the other end to the first package terminal 3.1. The design of the choke D is arbitrary; as a rule, ferrite material will be used on cost grounds and because of the compact design.

The low-frequency current components il5 are fed back to the voltage regulator 1 via a low-resistance and low-inductance connection 15 between the second and fourth contact pads 2.2, 2.4. After the fourth contact pad 2.4, the two current components il, il5 are routed via the Fourth interconnection 4.4, the fourth package terminal 3.4, and finally the second supply line v2. The low-resistance and low-inductance connection 15 should not be implemented as a wire bond, so that the remaining radio-frequency current component ih4, which is superimposed on the current component il5, cannot influence the internal ground potential VS through the bond wire inductance.

From the schematic circuit diagram of FIG. 3 with the current components shown therein it is apparent that the radio-frequency current components ih, ih2, ih3 of the first subcircuit, with the exception of the current component ih4, which tends to zero, are completely separated from the low-frequency current components il of the second subcircuit 6 in the entire board network B. Thus, the internal reference potential VS is not interfered with and has a stable level, which is essentially identical with the reference level VSS of the voltage regulator 1.

The separate current paths for the two subcircuits 5, 6 have an added advantage in that the size of the choke D is no longer limited, because only the low-frequency current components il5 of the first subcircuit 5 and no radio-frequency current components except the residual current ih4, which tends to zero, pass through it. Therefore, the selectivity of the choke D is of interest only inasmuch as it suffices to keep the radio-frequency current components ih, ih2, ih3 away from the supply lines v1, v2. The resulting resonant frequency formed by the choke D and the capacitor C1 is so low that no electromagnetic waves are radiated as spurious emission. By a suitable choice of the internal attenuation of the resonant circuit, oscillation is prevented in any case. Since this terminal configuration ensures that the second subcircuit 6 has its driver stages connected to a stable internal supply voltage VDS or a stable internal ground potential VS, no rapid level fluctuations occur on the I/O lines. This is an essential reason for the spurious-emission-reducing effect of the terminal configuration described. It goes without saying that the radiating areas, which are formed by current loops in the regions of the supply lines v1, v2 and the I/O lines, have to be kept as small as possible.

It will be understood that the embodiment described herein is merely exemplary and that a person skilled in the art may make many variations and modifications to the described embodiment utilizing functionally equivalent elements to those described. Any variations or modifications to the invention described hereinabove are intended to be included within the scope of the invention as defined by the appended claims.

What is claimed is:

1. A spurious-emission-reducing terminal configuration for an integrated circuit, particularly a monolithic integrated circuit, operable within an unshielded board network, wherein the integrated circuit is divided into a first subcircuit, which has essentially radio-frequency current components, and a second subcircuit, which has essentially low-frequency current components, the dividing also extending to internal supply lines and supply contact pads; and the second subcircuit including driver circuits connected to input/output lines on the board network, the terminal configuration comprising:

at least within a connection section spatially defined by external filter means and the supply contact pads, supply currents for the first and second subcircuits are respectively routed over a first supply current path and a second supply current path; and on a grounded side, the first and second supply current paths are interconnected by a low-resistance and low-inductance connection to establish a ground point for the integrated circuit;

wherein, within the integrated circuit, a very short current path is provided for at least a part of the radio-frequency current components by means of an internal blocking capacitor.

2. The terminal configuration according to claim 1, wherein the external filter means comprise a first blocking capacitor and a choke, the first blocking capacitor closing the first supply current path externally for those radio-frequency current components which are not blocked by an internal blocking capacitor, and the choke connecting the first supply current path to the second supply current path on an ungrounded supply voltage side.

3. The terminal configuration according to claim 1, wherein the external filter means comprise a blocking capacitor, which short-circuits the second supply current path for radio-frequency current components of the second subcircuit.

4. A spurious-emission-reducing terminal configuration for an integrated circuit, particularly a monolithic integrated circuit, which is enclosed in a package and is operable within an unshielded board network, wherein the integrated circuit is divided into a first subcircuit, which has essentially radio-frequency current components, and a second subcircuit, which has essentially low-frequency current components, the dividing also extending to internal supply lines and supply contact pads, and the second subcircuit includes driver circuits which have to be connected to input/output lines on the board network, the terminal configuration comprising:

within the package and terminals thereof, supply currents for the first and second subcircuits are respectively routed over a first supply current path and a second supply current path; and on a grounded side, the first and second supply current paths are interconnected by a low-resistance and low-inductance connection to establish a ground point for the integrated circuit;

wherein within the package, an especially short current path is provided for at least a part of the radio-frequency current components by means of an internal blocking capacitor.

5. A spurious-emission-reducing terminal configuration for an integrated circuit, particularly a monolithic integrated circuit, operable within an unshielded board network, wherein the integrated circuit is divided into a first subcircuit, which has essentially radio-frequency current components, and a second subcircuit, which has essentially low-frequency current components, the dividing also extending to internal supply lines and supply contact pads, and the second subcircuit includes driver circuit which have to be connected to input/output lines on the board network, the terminal configuration comprising:

supply currents for the first and second subcircuits are routed within the integrated circuit over a first supply current path with associated contact pads and a second supply current path with associated contact pads, respectively; and within the integrated circuit, the first and second supply current paths are interconnected on the grounded side by a low-resistance and low-inductance connection to establish a ground point;

wherein within the integrated circuit, a very short current path is provided for at least a part of the radio-frequency current components by means of an internal blocking capacitor.

6. A method for reducing spurious emissions in an integrated circuit which is operable within an unshielded board network, the integrated circuit being divided into a first subcircuit, which has essentially radio-frequency current components, and a second subcircuit, which has essentially low-frequency current components, the dividing also extending to internal supply lines and supply contact pads; and the second subcircuit including driver circuits connected to input/output lines on the board network, the method comprising the steps of:

respectively routing supply currents for the first and second subcircuit over a first supply current path and a second supply current path; and interconnecting the first and second supply current paths on a grounded side by a low-resistance and low-inductance connection to establish a ground point for the integrated circuit;

wherein, a short current path is provided for at least a part of the radio-frequency current components by means of an internal blocking capacitor.

7. The method according to claim 6, wherein said step of respectively routing takes place at least within a connection section spatially defined by external filter means and the supply contact pads.

8. The method according to claim 6, wherein the external filter means comprise a first blocking capacitor and a choke, the first blocking capacitor closing the first supply current path externally for those radio-frequency current components which are not blocked by an internal blocking capacitor, and the choke connecting the first supply current path to the second supply current path on an ungrounded supply voltage side.

9. The method according to claim 6, wherein the external filter means comprise a blocking capacitor, which short-circuits the second supply current path for radio-frequency current components of the second subcircuit.

10. A spurious-emission-reducing terminal configuration for an integrated circuit, operable within an unshielded board network, wherein the integrated circuit is divided into a first subcircuit and a second subcircuit, the terminal configuration comprising:

means for respectively routing supply currents for the first and second subcircuits at a connection section spatially defined by external filter means and supply contact pads of the circuit; and a low-resistance and low-inductance connection for interconnecting said supply currents on a grounded side to establish a ground point for the integrated circuit;

wherein within the integrated circuit, a very short current path is provided for at least a part of the radio-frequency current components by means of an internal blocking capacitor.

11. The terminal configuration according to claim 10, wherein the first subcircuit essentially has radio-frequency current components, and the second subcircuit essentially has low-frequency current components.

12. The terminal configuration according to claim 10, wherein the integrated circuit includes internal supply lines, the supply contact pads and the internal supply lines being divided.

13. The terminal configuration according to claim 10, wherein the second subcircuit includes driver circuits connected to input/output lines on the board network.

14. The terminal configuration according to claim 10, wherein the supply currents are respectively routed over a first supply current path and a second supply current path by the routing means.

15. The terminal configuration according to claim 10, wherein the first subcircuit essentially has radio-frequency current components, the second subcircuit essentially has low-frequency current components and the supply currents are respectively routed over a first supply current path and a second supply current path by the routing means.

16. The terminal configuration according to claim 15, wherein the external filter means comprise a blocking capacitor, which short-circuits the second supply current path for radio-frequency current components of the second subcircuit.

17. The terminal configuration according to claim 15, wherein the external filter means comprise a first blocking capacitor and a choke, the first blocking capacitor closing the first supply current path externally for those radio-frequency current components which are not blocked by an internal blocking capacitor, and the choke connecting the first supply current path to the second supply current path on an ungrounded supply voltage side.

18. The terminal configuration according to claim 10, wherein the integrated circuit is enclosed in a package.

* * * * *